United States Patent [19]

Haynie et al.

[11] Patent Number: 4,887,011

[45] Date of Patent: Dec. 12, 1989

[54] COMPUTER MONITOR VERTICAL SWEEP GENERATOR HAVING FREQUENCY INDEPENDENT HEIGHT CONTROL AND "S" WAVEFORM CORRECTION

[76] Inventors: Carl R. Haynie, 4738 Jan Dr., Carmichael, Calif. 95608; Kirk P. Gipson, 2271 Independence Way, Roseville, Calif. 95678; Gary H. Nichols, 2570 Shirland Tract Rd., Auburn, Calif. 95603

[21] Appl. No.: 314,601

[22] Filed: Feb. 23, 1989

[51] Int. Cl.$^4$ .................. H01J 29/70; H01J 29/76
[52] U.S. Cl. .................................... 315/403; 315/371
[58] Field of Search ................... 315/403, 408, 371

[56] References Cited

U.S. PATENT DOCUMENTS

| | | | |
|---|---|---|---|
| 4,490,653 | 12/1984 | Olmstead | 315/403 |
| 4,691,147 | 9/1987 | Kashiwagi | 315/371 |
| 4,810,940 | 3/1989 | Ogino et al. | 315/389 |

*Primary Examiner*—Theodore M. Blum
*Attorney, Agent, or Firm*—Roland I. Griffin

[57] ABSTRACT

A signal generator which generates an amplified yoke signal for application to a vertical yoke of a cathode ray tube monitor is presented. The signal generator includes a linear ramp generator and a correction generator. The linear ramp generator has an output on which is placed a ramp signal. The linear ramp generator also has a first input which receives a clock signal. The frequency of oscillation of the clock signal determines the frequency of oscillation of the ramp signal. The linear ramp generator additionally has a second input for receiving a height adjustment signal. The linear ramp generator varies the maximum voltage range of the ramp signal responsive to the height adjustment signal. The maximum voltage range is varied independent of the frequency of oscillation of the ramp signal. The correction generator receives the ramp signal from the linear ramp generator and generates an "S" correction signal. A summing circuit receives the ramp signal from the linear ramp generator and receives the "S" correction signal from the correction generator. The summing circuit sums the two signals to produce an unamplified yoke signal. An amplifier receives the unamplified yoke signal from the summing circuit and produces the amplified yoke signal.

3 Claims, 5 Drawing Sheets

COMPUTER MONITOR VERTICAL SWEEP GENERATOR HAVING FREQUENCY INDEPENDENT HEIGHT CONTROL AND "S" WAVEFORM CORRECTION

BACKGROUND

The present invention concerns the generation of a ramp waveform which is used to drive the vertical deflection coils of a cathode ray tube (CRT) monitor.

A typical prior art circuit which generates a ramp waveform used to drive the vertical deflection coils of a CRT monitor is shown in FIG. 2. A current source 2 charges a capacitor 5. Based on the voltage at the junction of current source 2 and capacitor 5 a power amplifier 4 generates a signal 8 which is connected to the vertical deflection coils. A transistor 9 controlled by an input 3 is used to discharge capacitor 5. The gradual charging of capacitor 5 and the rapid discharge of capacitor 5 by transistor results in signal 8 having a ramp waveform. A variable resistor 7 and a capacitor 6 are shown coupled in series between power amplifier 4 and ground. Capacitor 5, capacitor 6 and variable resistor 7 provide "S" waveform correction for signal 8. This is necessary to take into account the different path lengths of an electron beam in the CRT monitor.

One shortcoming of the circuit in FIG. 2 is that if the frequency of the signal supplied by linear ramp generator varies, this will affect the "S" waveform correction and the magnitude of the ramp waveform of signal 8. Therefore, in order to vary the frequency of the linear ramp generator at order to maintain the same "S" waveform correction and magnitude of the ramp waveform of signal 8.

SUMMARY OF THE INVENTION

In accordance with the preferred embodiment of the present invention a signal generator which generates an amplified yoke signal for application to a vertical yoke of a cathode ray tube monitor is presented. The signal generator includes a linear ramp generator and a correction generator. The linear ramp generator has an output on which is placed a ramp signal. What is meant by a ramp signal is a signal whose voltage starts at a reference voltage increases linearly over time. Periodically at a frequency of oscillation, the voltage of the ramp signal abruptly falls back to the reference voltage and again immediately begins increasing linearly over time.

The linear ramp generator also has a first input which receives a clock signal. The frequency of oscillation of the clock signal determines the frequency of oscillation of the ramp signal. The linear ramp generator additionally has a second input for receiving a height adjustment signal. The linear ramp generator varies the maximum voltage range of the ramp signal responsive to the height adjustment signal. The maximum voltage range is varied independent of the frequency of oscillation of the ramp signal. That is, for a given voltage value of the height adjustment signal, the maximum voltage range of the ramp signal does not vary on the basis of the frequency of oscillation of the ramp signal.

The correction generator receives the ramp signal from the linear ramp generator and generates an "S" correction signal. An "S" correction signal is a signal which from a peak voltage, decreases voltage parabolically until a reference voltage is reached. At the reference voltage the waveform inflects and negative voltage increases parabolically until a negative peak voltage is reached.

A summing circuit receives the ramp signal from the linear ramp generator and receives the "S" correction signal from the correction generator. The summing circuit sums the two signals to produce an unamplified yoke signal. An amplifier receives the unamplified yoke signal from the summing circuit and produces the amplified yoke signal.

DESCRIPTION OF THE PREFERRED EMBODIMENT

Figure 1:
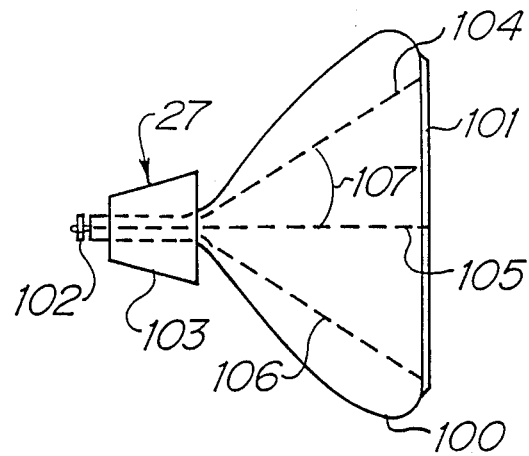
FIG. 1 shows a CRT monitor.
Figure 2:
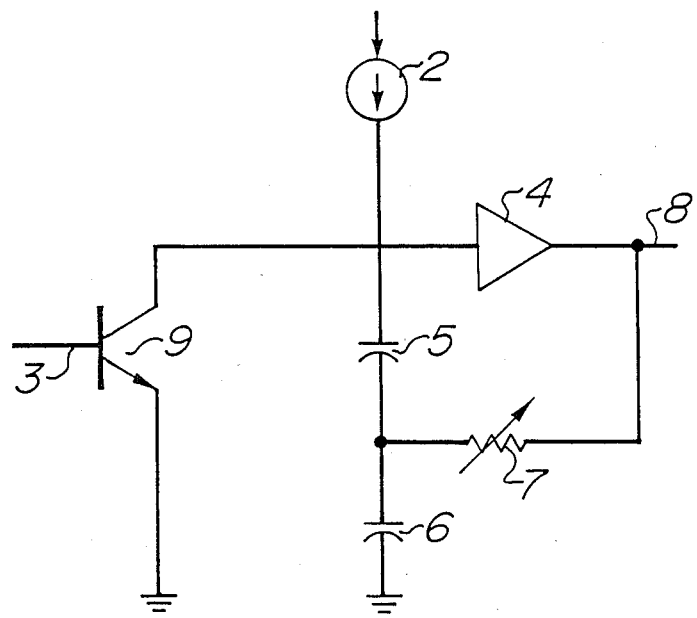
FIG. 2 shows an example of a prior art circuit which generates a ramp waveform used to drive the vertical deflection coils of a CRT monitor.

FIG. 1 shows a functional diagram of a cathode ray tube (CRT) monitor 100. An electron gun 102 produces a stream of electrons 105 which generate light upon colliding with a screen 101. Deflection coils 103 driven by a signal placed on a vertical yoke input 27 deflect the path of electron stream 105. To illustrate this deflection a deflected path 104 of electron stream 105 and a deflected path 106 of electron stream 105 are shown. A deflection angle 107 is directly dependent upon the current of the signal placed on vertical yoke input 27. So that horizontal lines on screen 101 are evenly spaced, the current of the signal placed on vertical yoke input 27 requires "S" correction to take into account the increasing amount an increase in angle 107 results in an increase in the vertical travel of electron stream 105 before colliding with screen 101.

Figure 3:
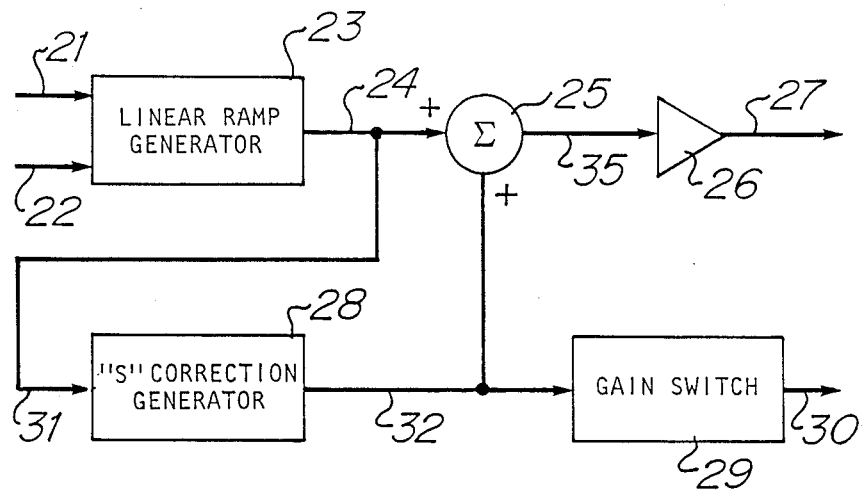
FIG. 3 shows a block diagram of a circuit which generates a ramp waveform used to drive the vertical deflection coils of a CRT monitor in accordance with the preferred embodiment of the present invention.

FIG. 3 is a block diagram of a circuit which generates a signal with a ramp waveform used to generate signal 27. A linear ramp generator 23 has an input 21 which receives a clock pulse 201 shown in FIG. 7. The frequency of clock pulse 201 determines the frequency of a ramp signal 202—also shown in FIG. 7—which is produced by linear ramp generator 23 and placed on an output 24. Linear ramp generator 23 also has an input 22 upon which is placed a direct current (DC) signal. The value of the voltage of the DC signal determines the peak-to-peak voltage of signal 203. In the preferred embodiment of the present invention the peak-to-peak voltage of signal 203 is unaffected by a change in the frequency of clock pulse 201.

Output 24 feeds into a summation circuit 25. Output 24 is also tapped by an input 31 of an "S" correction generator 28. "S" correction generator 28 produces a signal 205—shown in FIG. 7—on an output 32. Signal 205 is fed into summation circuit 25 and into a gain switch 29. Gain switch 29 essentially acts as a rectifier to produce a signal 206—shown in FIG. 7—on an output 30. Signal 206 is a pincushion correction signal used in the generation of a signal applied to a horizontal yoke of CRT monitor 100.

Figure 7:
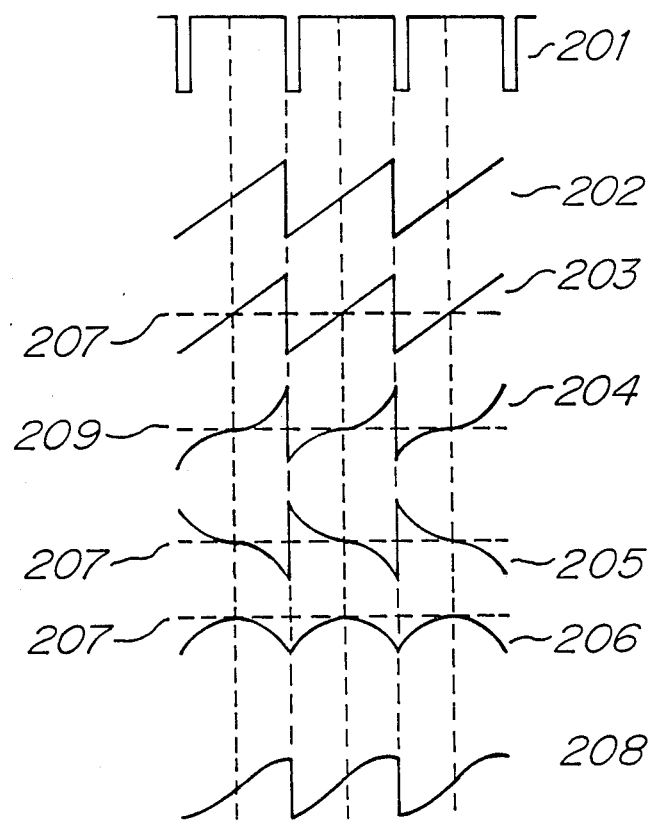
FIG. 7 shows various waveforms of signals at certain locations within the circuit shown in FIG. 3 in accordance with the preferred embodiment of the present invention.

Summation circuit 25 produces a signal 208—shown in FIG. 7—on an output 35. Signal 208 is amplified by an amplifier 26 and applied to vertical yoke input 27.

Figure 4:
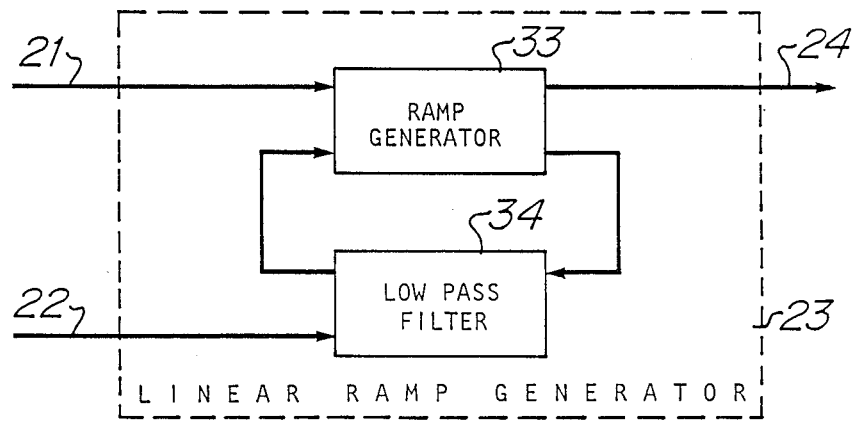
FIG. 4 shows a block diagram of a linear ramp generator circuit shown in FIG. 3 in accordance with the preferred embodiment of the present invention.

In FIG. 4 linear ramp generator 23 is shown to include a ramp integrator 33 and a low pass filter 34 connected as shown.

Figure 5:
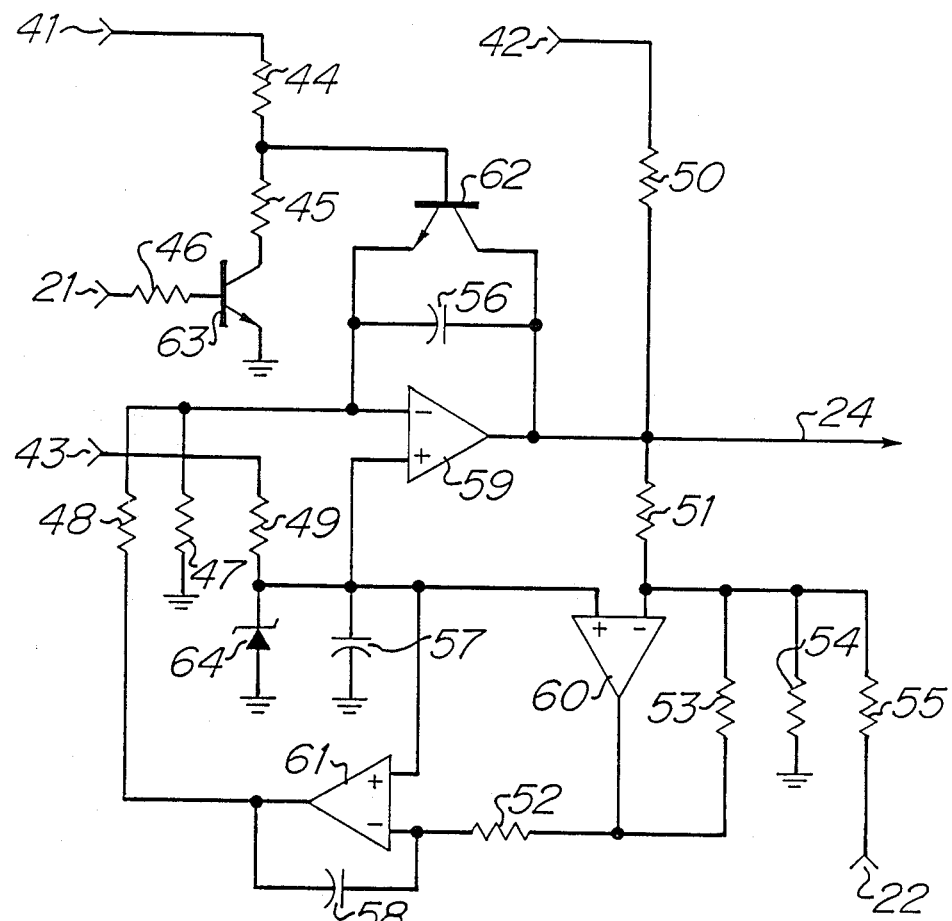
FIG. 5 shows a discreet component level schematic of the linear ramp generator shown in FIG. 3 in accordance with the preferred embodiment of the present invention.

FIG. 5 shows a circuit level implementation of linear ramp generator 23. On an input 41, an input 42 and an input 43 is placed a twenty-five volt DC power signal. An impedance 44 is a 12 kilohm resistor. An impedance 45 is a 3.3 kilohm resistor. An impedance 46 is a 1.5 kilohm resistor. An impedance 47 is a 33 kilohm resistor. An impedance 48 is a 33 kilohm resistor. An impedance 49 is a 22 kilohm resistor. An impedance 50 is a 4.7 kilohm resistor. An impedance 51 is a 34.8 kilohm resistor with a 1 percent tolerance. An impedance 52 is a 33 kilohm resistor. An impedance 53 is a 21.5 kilohm resistor with a 1 percent tolerance. An impedance 54 is a 68.1 kilohm resistor with a 1 percent tolerance. An impedance 55 is a 261 kilohm resistor with a 1 percent tolerance.

Figure 6:
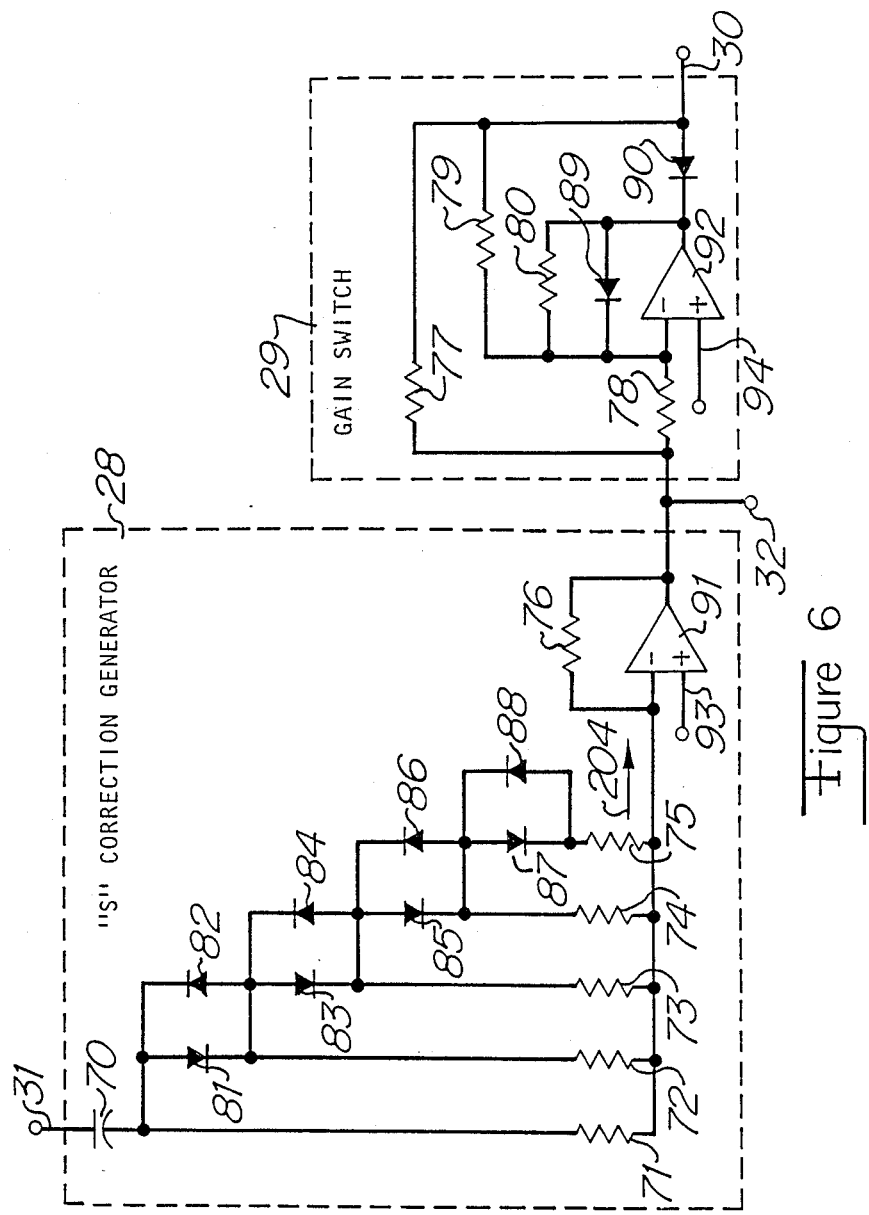
FIG. 6 shows a discreet component level schematic of an "S" correction generator and a gain switch shown in FIG. 3 in accordance with the preferred embodiment of the present invention.

The preferred circuit level implementation of linear ramp generator 23 also includes a 0.22 microfarad capacitor 56, a 0.1 micro farad capacitor 57 and a 1.0 microfarad capacitor 58 connected as shown in FIG. 5. Also included within the preferred circuit level implementation of linear ramp generator 23 is an amplifier 59, an amplifier 60 and an amplifier 61. Amplifier 59, amplifier 60 and amplifier 61 are each a 1/4 LM324 operational amplifier. A 2N4401 transistor 62 and a 2N4401 transistor 63 are connected as shown. A zenar diode 64 with a reverse voltage of 6.11 volts is also connected as shown in FIG. 5. FIG. 6 shows a circuit level implementation of "S" correction generator 28 and gain switch 29. "S" correction generator 28 includes a 100 microfarad input capacitor 70. Input capacitor 70 receives signal 202 and produces a signal 203, shown in FIG. 7. An array of diodes which consists of a 1N4150 diode 81, a 1N4150 diode 82, a 1N4150 diode 83, a 1N4150 diode 84, a 1N4150 diode 85, a 1N4150 diode 86, a 1N4150 diode 87 and a 1N4150 diode 88 is connected in the pattern shown in FIG. 6. Connected to the array of diodes is a resistor 71 having an impedance of 1 megohm, a resistor 72 having an impedance of 40 kilohms, a resistor 73 having an impedance of 20 kilohms, a resistor 74 having an impedance of 13.3 kilohms and a resistor 75 having an impedance of 10.2 kilohms. An operational amplifier 91 is connected to resistors 71, 72, 73, 74 and 75 as shown. An input 93 is held at a reference voltage 207. Connected to operational amplifier 91 is a resistor 76 having an impedance of 4.0 kilohms. A current 204 flows through resistor 76.

Gain switch 29 includes an operational amplifier 92 with an input 94 connected to held at reference voltage 207. Operational amplifier 92 is coupled to a 110 kilohm input resistor 78 and a diode 90. A feed back network includes a 10 kilohm resistor 77, a 100 kilohm resistor 79, a 2.2 megohm resistor 80 and a diode 89.

FIG. 7 shows the waveforms of various signals within the circuit shown in FIG. 3. Waveforms for signals 201, 202, 203, 205, 206 and 208 all show voltage as a function of time. Reference voltage 207 is shown in relation to the waveforms for signals 203, 205 and 207. The waveform for current signal 204 show current as a function of time. Shown in relation to the waveform for current signal 204 is a zero current level 209.

I claim:

1. A signal generator for generating an amplified yoke signal, the signal generator comprising:
   linear ramp generator means for producing a ramp signal with a ramp-shaped voltage waveform, the linear ramp generator including
   a first input for receiving a clock signal, an oscillation frequency of the clock signal determining an oscillation frequency of the ramp signal,
   a second input for receiving a height adjustment signal,
   a linear ramp generator output upon which the ramp signal is placed,
   ramp integrator means, coupled to the first input and the linear ramp generator output, for generating the ramp signal, the ramp signal having a same oscillation frequency as the clock signal, and for placing the ramp signal upon the linear ramp generator output, and
   low pass filter means, coupled to the second input and to the ramp integrator means, for, responsive to the height adjustment signal, varying peak voltage of the ramp signal independent of the frequency of the clock signal;
   correction generator means for generating an "S" correction signal, the correction generator means including
   a correction generator input coupled to the linear ramp generator output,
   frequency independent generator means for receiving the ramp signal from the correction generator input and for generating the "S" correction signal, the amount of voltage adjustment not being dependent upon the frequency of the ramp signal, and
   a correction generator output upon which the "S" correction signal is placed;
   summation means coupled to the linear ramp generator output and the correction generator output for summing the ramp signal and the "S" correction signal to generate an unamplified yoke signal, the summation means having a summation output upon which the unamplified yoke signal is placed; and,
   amplifier, coupled to the summation output, for receiving the unamplified yoke signal and producing the amplified yoke signal.

2. A signal generator as in claim 1 additionally comprising:
   gain switch means, coupled to the correction generator output, for rectifying the "S" correction signal to produce a pincushion correction signal.

3. A signal generator as in claim 1 wherein the frequency independent generator comprises:
   an amplifier having a first input coupled to a reference voltage, a second input, and an output coupled to the correction generator output; and,
   a piecewise linear network which operates on the ramp signal to produce the "S" correction signal with a voltage waveform in the approximate form of a parabolic curve, the piecewise linear network including a plurality of diode pairs coupled in series, one end of the plurality of diode pairs coupled to the correction generator input wherein each diode pair comprises two diodes coupled in parallel, a cathode of a first of the two diodes being coupled to an anode of a second of the two diodes and an anode of the first of the two diodes being coupled to a cathode of the second of the two diodes, and a plurality of resistors, each resistor in the plurality of resistors being coupled to the second input of the amplifier and to at least one diode pair from the plurality of diode pairs.

* * * * *